US009490815B2

(12) United States Patent
Vrudhula et al.

(10) Patent No.: US 9,490,815 B2
(45) Date of Patent: Nov. 8, 2016

(54) ROBUST, LOW POWER, RECONFIGURABLE THRESHOLD LOGIC ARRAY

(71) Applicant: ARIZONA BOARD OF REGENTS ON BEHALF OF ARIZONA STATE UNIVERSITY, Scottsdale, AZ (US)

(72) Inventors: Sarma Vrudhula, Chandler, AZ (US); Niranjan Kulkarni, Tempe, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 0 days.

(21) Appl. No.: 14/903,428

(22) PCT Filed: Jul. 8, 2014

(86) PCT No.: PCT/US2014/045778
§ 371 (c)(1),
(2) Date: Jan. 7, 2016

(87) PCT Pub. No.: WO2015/006342
PCT Pub. Date: Jan. 15, 2015

(65) Prior Publication Data
US 2016/0164526 A1    Jun. 9, 2016

Related U.S. Application Data

(60) Provisional application No. 61/843,652, filed on Jul. 8, 2013.

(51) Int. Cl.
*H03K 19/23* (2006.01)
*H03K 19/177* (2006.01)
*H03K 19/00* (2006.01)

(52) U.S. Cl.
CPC ...... *H03K 19/1778* (2013.01); *H03K 19/0013* (2013.01); *H03K 19/17736* (2013.01); *H03K 19/17768* (2013.01); *H03K 19/23* (2013.01)

(58) Field of Classification Search
CPC .................................................. H03K 19/23
USPC ............................................ 326/9–13, 35–36
See application file for complete search history.

(56) References Cited

U.S. PATENT DOCUMENTS

| 3,950,636 A * | 4/1976 | Dao ...................... G06F 7/5318 |
| | | 708/626 |
| 5,486,774 A | 1/1996 | Douseki et al. |

(Continued)

FOREIGN PATENT DOCUMENTS

| KR | 1020040011992 A | 2/2004 |
| WO | 2010048206 A1 | 4/2010 |

OTHER PUBLICATIONS

Appenzeller, Joerg, et al., "Comparing Carbon Nanotube Transistors—The Ideal Choice: A Novel Tunneling Device Design," IEEE Transactions on Electron Devices, vol. 52, Issue 12, Dec. 2005, IEEE, pp. 2568-2576.

(Continued)

*Primary Examiner* — Jason M Crawford
(74) *Attorney, Agent, or Firm* — Withrow & Terranova, P.L.L.C.

(57) ABSTRACT

A field programmable threshold-logic array (FPTLA) includes a number of threshold logic gates and a number of programmable interconnect elements. Each one of the programmable interconnect elements are connected between two or more of the threshold logic gates, such that the programmable interconnect elements route signals between the threshold logic gates. By using threshold logic gates for the FPTLA, the size of the FPTLA may be significantly smaller than conventional solutions. Further, using threshold logic gates results in significant improvements in the computation speed of the FPTLA when compared to conventional solutions.

29 Claims, 4 Drawing Sheets

(56) References Cited

U.S. PATENT DOCUMENTS

| | | | |
|---|---|---|---|
| 5,664,211 A * | 9/1997 | Sobelman | G06F 7/502 345/441 |
| 5,859,548 A | 1/1999 | Kong | |
| 5,991,789 A | 11/1999 | Prange et al. | |
| 6,002,270 A | 12/1999 | Timoc | |
| 6,046,608 A | 4/2000 | Theogarajan | |
| 6,278,298 B1 | 8/2001 | Hayakawa | |
| 6,381,181 B1 | 4/2002 | Nguyen | |
| 6,392,467 B1 | 5/2002 | Oowaki et al. | |
| 6,420,905 B1 | 7/2002 | Davis et al. | |
| 6,424,181 B1 | 7/2002 | Pogrebnoy | |
| 6,437,604 B1 | 8/2002 | Forbes | |
| 6,580,296 B1 | 6/2003 | Beiu | |
| 6,838,909 B2 | 1/2005 | Huang et al. | |
| 6,861,887 B2 | 3/2005 | Jeong et al. | |
| 7,417,468 B2 | 8/2008 | Verbauwhede et al. | |
| 7,835,898 B2 | 11/2010 | Geist et al. | |
| 8,164,359 B2 * | 4/2012 | Leshner | H03K 19/0813 326/113 |
| 8,181,133 B2 | 5/2012 | Gowda et al. | |
| 8,832,614 B2 | 9/2014 | Vrudhula et al. | |
| 9,306,151 B2 | 4/2016 | Vrudhula et al. | |
| 2002/0184174 A1 | 12/2002 | Kadri | |
| 2003/0067324 A1 | 4/2003 | Warner | |
| 2005/0262456 A1 | 11/2005 | Prasad | |
| 2006/0119406 A1 | 6/2006 | Henzler et al. | |
| 2008/0100344 A1 | 5/2008 | Ngo et al. | |
| 2009/0300563 A1 | 12/2009 | Moon | |
| 2010/0321061 A1 | 12/2010 | Leshner et al. | |
| 2011/0214095 A1 | 9/2011 | Gowda et al. | |
| 2013/0313623 A1 * | 11/2013 | Vrudhula | H01L 43/02 257/295 |

OTHER PUBLICATIONS

Augustine, Charles, et al., "Spin-Transfer Torque MRAMs for Low Power Memories: Perspective and Prospective," IEEE Sensors Journal, vol. 12, Issue 4, Apr. 2012, IEEE, pp. 756-766.

Avedillo, Maria, et al., "A Threshold Logic Synthesis Tool for RTD Circuits," Euromicro Symposium on Digital System Design, Aug. 31-Sep. 3, 2004, France, IEEE, pp. 624-627.

Avedillo, Maria, et al., "Low-power CMOS threshold-logic gate," Electronics Letters, vol. 31, Issue 25, Dec. 1995, IEEE, pp. 2157-2159.

Avouris, Phaedon, et al., "Carbon Nanotube Electronics," Proceedings of the IEEE, vol. 91, Issue 11, Nov. 2003, IEEE, pp. 1772-1784.

Bahar, R.I., et al., "A Symbolic Method to Reduce Power Consumption of Circuits Containing False Paths," IEEE/ACM International Conference on Computer-Aided Design, Nov. 6-10, 1994, San Jose, California, ACM, pp. 368-371.

Beiu, Valeriu, "A Survey of Perceptron Circuit Complexity Results," Proceedings of the International Joint conference on Neural Networks, vol. 2, Jul. 20-24, 2003, IEEE, pp. 989-994.

Beiu, Valeriu, et al., "VLSI Implementations of Threshold Logic—A Comprehensive Survey," IEEE Transactions on Neural Networks, vol. 14, Issue 5, Sep. 2003, IEEE, pp. 1217-1243.

Berezowski, Krzysztof, et al., "Automatic Design of Binary and Multiple-Valued Logic Gates on RTD Series," 8th Euromicro Conference on Digital System Design, Aug. 30-Sep. 3, 2005, IEEE, 4 pages.

Blair, Enrique, et al., "Quantum-Dot Cellular Automata: An Architecture for Molecular Computing," International Conference on Simulation of Semiconductor Processes and Devices, Sep. 3-5, 2003, Boston, Massachusetts, IEEE, pp. 14-18.

Celinski, Peter, et al., "State-of-the-Art in CMOS Threshold-Logic VLSI Gate Implementations and Applications," Proceedings of SPIE, vol. 5117, Apr. 2003, SPIE, pp. 53-64.

Chatterjee, Satrajit, et al., "Factor Cuts," IEEE/ACM International Conference on Computer-Aided Design, Nov. 5-9, 2006, San Jose, California, IEEE, pp. 143-150.

Chen, Kevin, et al., "Novel Current-Voltage Characteristics of an InP-Based Resonant-Tunneling High Electron Mobility Transistor and Their Circuit Applications," International Electron Devices Meeting, Dec. 10-13, 1995, Washington, DC, IEEE, pp. 379-382.

Chuang, Weitong, et al., "A Unified Algorithm for Gate Sizing and Clock Skew Optimization to Minimize Sequential Circuit Area," IEEE/ACM International Conference on Computer-Aided Design, Nov. 7-11, 1993, Santa Clara, California, IEEE, pp. 220-223.

Coudert, Olivier, "Gate Sizing for Constrained Delay/Power/Area Optimization," IEEE Transactions on Very Large Scale Integration (VLSI) Systems, vol. 5, Issue 4, Dec. 1997, pp. 465-472.

Eguro, Kenneth, "Supporting High-Performance Pipelined Computation in Commodity-Style FPGAs," Doctoral Dissertation, University of Washington, 2008, 178 pages.

Eppstein, David, "Small Maximal Independent Sets and Faster Exact Graph Coloring," Journal of Graph Algorithms and Applications, vol. 7, Issue 2, 2003, pp. 131-140.

Falkowski, Bogdan, "Spectral Techniques and Decision Diagrams—Guest Editorial," VLSE Design, vol. 14, Issue 1, 2002, Taylor & Francis Ltd, pp. 1-3.

Gang, Yi, et al., "A High-Reliability, Low-Power Magnetic Full Adder," IEEE Transactions on Magnetics, vol. 47, Issue 11, Nov. 2011, IEEE, pp. 4611-4616.

Girard, P., et al., "A Gate Resizing Technique for High Reduction in Power Consumption," International Symposium on Low Power Electronics and Design, Aug. 18-20, 1997, Monterey, California, IEEE, pp. 281-286.

Gowda, Tejaswi, et al., "A Non-ILP Based Threshold Logic Synthesis Methodology," 16th International Workshop on Logic and Synthesis, May 30-Jun. 1, 2007, San Diego, California, 8 pages.

Gowda, Tejaswi, et al., "Combinational Equivalence Checking for Threshold Logic Circuits," Proceedings of the 17th ACM Great Lakes symposium on VLSI, Mar. 11-13, 2007, Stresa-Lago Maggiore, Italy, ACM, pp. 102-107.

Gowda, Tejaswi, et al., "Decomposition Based Approach for Synthesis of Multi-Level Threshold Logic Circuits," Asia and South Pacific Design Automation Conference, Mar. 21-24, 2008, Seoul, South Korea, IEEE, 6 pages.

Gowda, Tejaswi, et al., "Identification of Threshold Functions and Synthesis of Threshold Networks," IEEE Transactions on Computer-Aided Design of Integrated Circuits and Systems, vol. 30, Issue 5, May 2011, IEEE, pp. 665-677.

Gowda, Tejaswi, et al., "Synthesis of Threshold Logic Circuits Using Tree Matching," 18th European Conference on Circuit Theory and Design, Aug. 27-30, 2007, Seville, Spain, IEEE, 4 pages.

Gupta, Pallav, et al., "An Algorithm for Nanopipelining of RTD-Based Circuits and Architectures," IEEE Transactions on Nanotechnology, vol. 4, Issue 2, Mar. 2005, IEEE, pp. 159-167.

Hidalgo-Lopez, J.A., et al., "New Types of Digital Comparators," International Symposium on Circuits and Systems, vol. 1, Apr. 30-May 3, 1995, Seattle, Washington, IEEE, pp. 29-32.

Hopcroft, J.E., et al., "Synthesis of Minimal Threshold Logic Networks," IEEE Transactions on Electronic Computers, vol. EC-14, Issue 4, Aug. 1965, IEEE, pp. 552-560.

Hulgaard, Henrik, et al., "Equivalence Checking of Combinational Circuits Using Boolean Expression Diagrams," IEEE Transactions on Computer-Aided Design of Integrated Circuits and Systems, vol. 18, Issue 7, Jul. 1999, IEEE, pp. 903-917.

Jian, Ping Sun, et al., "Resonant Tunneling Diodes: Models and Properties," Proceedings of the IEEE, vol. 86, Issue 4, Apr. 1998, IEEE, pp. 641-661.

Kagaris, Dimitri, et al. "Maximum weighted independent sets on transitive graphs and applications," Integration, the VLSI Journal, vol. 27, Issue 1, 1999, Elsevier Science B.V., pp. 77-86.

Kulkarni, Niranjan, et al., "Minimizing Area and Power of Sequential CMOS Circuits using Threshold Decomposition," IEEE/ACM International Conference on Computer-Aided Design, Nov. 5-8, 2012, San Jose, California, ACM, pp. 605-612.

Kulkarni, Niranjan, et al., "Technology Mapping for Power using Threshold Logic Cells", Great Lakes Symposium on VLSI, May 2-4, 2011, Lausanne, Switzerland, 6 pages.

(56) References Cited

OTHER PUBLICATIONS

Lageweg, Casper, et al., "A Full Adder Implementation Using Set Based Linear Threshold Gates," 9th International Conference on Electronics, Circuits and Systems, vol. 2, 2002, IEEE, pp. 665-668.
Lageweg, Casper, et al., "A Linear Threshold Gate Implementation in Single Electron Technology," IEEE Computer Society Workshop on VLSI, May 2001, Orlando, Florida, IEEE, pp. 93-98.
Lamoureux, Julien, et al., "GlitchLess: Dynamic Power Minimization in FPGAs Through Edge Alignment and Glitch Filtering," IEEE Transactions on Very Large Scale Integration (VLSI) Systems, vol. 16, Issue 11, Nov. 2008, IEEE, pp. 1521-1534.
Leshner, Samuel, et al., "Design of a robust, high performance standard cell threshold logic family for DSM technology," 22nd International Conference on Microelectronics, Dec. 19-22, 2010, Cairo, Egypt, IEEE, 4 pages.
Li, Jing, et al., "Design Paradigm for Robust Spin-Torque Transfer Magnetic RAM (STT MRAM) From Circuit/Architecture Perspective," IEEE Transactions on Very Large Scale Integration (VLSI) Systems, vol. 18, Issue 12, Dec. 2010, IEEE, pp. 1710-1723.
Likharev, Konstantin, "Single-Electron Devices and Their Applications," Proceedings of the IEEE, vol. 87, Issue 4, Apr. 1999, IEEE, pp. 606-632.
Luba, Tadeusz, et al., "Multi-level logic synthesis based on decomposition," Microprocessors and Microsystems, vol. 18, Issue 8, Oct. 1994, Butterworth-Heinemann Ltd, pp. 429-437.
Luu, Jason, et al., "VTR 7.0: Next Generation Architecture and CAD System for FPGAs," ACM Transactions on Reconfigurable Technology and Systems, vol. 7, Issue 2, Article 6, Jun. 2014, ACM, 30 pages.
Martin, Alain, et al., "ET2: A Metric for Time and Energy Efficiency of Computation," Power Aware Computing (book), 2002, Kluwer, 23 pages.
Nukala, Nishant, et al., "Spintronic Threshold Logic Array (STLA)—A Compact, Low Leakage, Non-volatile Gate Array Architecture," IEEE/ACM International Symposium on Nanoscale Architectures, Jul. 4-6, 2012, Amsterdam, Netherlands, IEEE, pp. 188-195.
Padure, Marius, et al., "A New Latch-Based Threshold Logic Family," International Semiconductor Conference, vol. 2, Oct. 2001, Sinaia, Romania, IEEE, pp. 531-534.
Pan, Peichen, et al., "A New Retiming-based Technology Mapping Algorithm for LUT-based FPGAs," Proceedings of the 1998 ACM/SIGDA Sixth International Symposium on Field Programmable Gate Arrays, Mar. 1998, Monterey, California, ACM, pp. 35-42.
Patil, Shruti, et al., "Spintronic Logic Gates for Spintronic Data Using Magnetic Tunnel Junctions," IEEE International Conference on Computer Design, Oct. 3-6, 2010, Amsterdam, Netherlands, IEEE, pp. 125-131.
Prost, W., et al., "Manufacturability and robust design of nanoelectronic logic circuits based on resonant tunnelling diodes," International Journal of Circuit Theory and Applications, vol. 28, 2000, John Wiley & Sons, Ltd., pp. 537-552.
Sentovich, Ellen, et al., "SIS: A System for Sequential Circuit Synthesis," Technical Report, Department of Electrical Engineering and Computer Science, University of California, Berkeley, May 4, 1992, 45 pages.
Sheng, C.L., "Compound Synthesis of Threshold-Logic Network for the Realization of General Boolean Functions," IEEE Transactions on Electronic Computers, vol. EC-14, Issue 6, Dec. 1965, pp. 798-814.
Strandberg, Roland, et al., "Single Input Current-Sensing Differential Logic (SCSDL)," IEEE International Symposium on Circuits and Systems, vol. 1, May 28-31, 2000, Geneva, Switzerland, IEEE, pp. 764-767.
Sulieman, M., et al., "Characterization of a 16-bit Threshold Logic Single-Electron Technology Adder," International Symposium on Circuits and Systems, vol. 3, May 23-26, 2004, IEEE, pp. 681-684.
Sun, Jian Ping, et al., "Resonant Tunneling Diodes: Models and Properties," Proceedings of the IEEE, vol. 86, Issue 4, Apr. 1998, IEEE, pp. 641-661.
Wang, Kuo-Hua, et al., "Technology Mapping for FPGA Using Generalized Functional Decomposition," VLSI Design, vol. 2, Issue 2, 1994, Gordan and Breach Science Publishers S.A., pp. 89-103.
Zhang, Li, et al., "An Input Weights Aware Synthesis Tool for Threshold Logic Networks," 16th Annual Workshop on Circuits, Systems and Signal Processing, Nov. 2005, Veldhoven, Netherlands, pp. 578-583.
Zhang, Yue, et al., "Compact Modeling of Perpendicular-Anisotropy CoFeB/MgO Magnetic Tunnel Junctions," IEEE Transactions on Electron Devices, vol. 59, Issue 3, Mar. 2012, IEEE, pp. 819-826.
Zhang, Rui, et al., "Synthesis and Optimization of Threshold Logic Networks with Application to Nanotechnologies," Design, Automation and Test in Europe Conference and Exhibition, vol. 2, Feb. 16-20, 2004, IEEE, 6 pages.
Zhang, Rui, et al., "Threshold Network Synthesis and Optimization and Its Application to Nanotechnologies," IEEE Transactions on Computer-Aided Design of Integrated Circuits and Systems, vol. 24, Issue 1, Jan. 2005, IEEE, pp. 107-118.
Zhao, Weisheng, et al., "Spin-MTJ based Non-Volatile Flip-Flop," 7th IEEE International Conference on Nanotechnology, Aug. 2-5, 2007, Hong Kong, IEEE, pp. 399-402.
Zheng, Yexin, et al., "Novel RTD-Based Threshold Logic Design and Verification," Master's Thesis, Virginia Polytechnic Institute and State University, Apr. 28, 2008, Blacksburg, Virginia, 57 pages.
Zilic, Zeljko, et al., "Using BDDs to Design ULMs for FPGAs," Proceedings of the Fourth International ACM Symposium on Field-Programmable Gate Arrays, 1996, IEEE, 7 pages.
International Search Report for PCT/US2009/061355, mailed Mar. 31, 2010, 4 pages.
International Preliminary Report on Patentability for PCT/US2009/061355, mailed May 5, 2011, 7 pages.
International Search Report and Written Opinion for PCT/US2014/045778, mailed Oct. 28, 2014, 10 pages.
International Preliminary Report on Patentability for PCT/US2014/045778, mailed Jan. 21, 2016, 7 pages.
Dertouzos, Michael, "Threshold Logic: A Synthesis Approach," (book excerpt), The M.I.T. Press, 1965, Cambridge, Massachusetts, pp. 1-7.
Edenfeld, D., et al., "International Technology Roadmap for Semiconductors," Lithography, 2003 Edition, 20 pages.
Hachtel, Gary, et al., "Logic Synthesis and Verification Algorithms," (book excerpt), Kluwer Academic Publishers, Boston, Massachusetts, 1996, pp. 194-196.
Kohavi, Zvi, et al., "Switching and Finite Automata Theory," (book excerpt), Chapter 7, Third Edition, Cambridge University Press, New York, New York, 2010, pp. 173-202.
Muroga, Saburo, "Threshold Logic and Its Applications," (book excerpt), Chapter 5, Wiley-Interscience, 1971, New York, New York, pp. 112-141.
Non-Final Office Action for U.S. Appl. No. 13/090,796, mailed Aug. 22, 2012, 9 pages.
Final Office Action for U.S. Appl. No. 13/090,796, mailed Feb. 22, 2013, 12 pages.
Notice of Allowance for U.S. Appl. No. 13/090,796, mailed Aug. 7, 2013, 8 pages.

* cited by examiner

US 9,490,815 B2

ROBUST, LOW POWER, RECONFIGURABLE THRESHOLD LOGIC ARRAY

RELATED APPLICATIONS

This application is a 35 U.S.C. §371 national phase filing of International Application No. PCT/US14/45778, filed Jul. 8, 2014, which claims priority to U.S. Provisional Application No. 61/843,652, filed Jul. 8, 2013, the disclosures of which are incorporated herein by reference in their entireties.

GOVERNMENT SUPPORT

This invention was made with government funds under contract number 1237856 awarded by the National Science Foundation. The government has certain rights in the invention.

FIELD OF THE DISCLOSURE

The present disclosure relates to threshold logic circuitry and in particular to programmable threshold logic circuitry.

BACKGROUND

Logic circuitry continues to be the platform on which modern electronic devices are built. In recent years, advancements in electronic devices and their associated software have crystallized the demand for logic circuitry that is faster, smaller, and more efficient. Currently, logic circuitry (e.g., application specific integrated circuits (ASICs), field programmable gate arrays (FPGAs), and the like) is dominated by the use of design paradigms that have been in place since the dawn of computing technology. Specifically, current logic circuits utilize a large number of individual AND, OR, NOT, etc. logic gates connected to one another in a particular fashion to perform a particular operation. Although generally accepted as standard practice, the use of these conventional design paradigms is quickly resulting in a plateau in the size, speed, and efficiency achievable by the resulting logic circuitry.

In an effort to continue improving the capabilities logic circuitry, many designers and manufacturers have started to explore alternative design strategies. Threshold logic gates have been studied and determined to result in more compact and faster circuits when compared to conventional logic gate equivalents. As defined herein, threshold logic gates are circuits that evaluate a threshold function. A threshold function (denoted as $f=[w_1, w_2, \ldots, w_n|T]$) is a Boolean function that receives multiple input values and a weight associated with each input value and computes a weighted sum of the input values and their corresponding weights. If the value of the weighted sum is above a predetermined threshold, the output of the threshold function is 1, whereas if the value of the weighted sum is below the predetermined threshold, the output of the threshold function is 0, as illustrated in Equation 1:

$$f(x_1, x_2, \ldots, x_n) = \begin{cases} 1 & \text{if } \sum_{i=1}^{n} w_i x_i \geq T \\ 0 & \text{otherwise} \end{cases} \quad (1)$$

where $f(x_1, x_2, \ldots, x_n)$ is the Boolean function including input values $x_1, x_2, \ldots, x_n$, $w_1, w_2, \ldots, w_i$ are the weights associated with each variable in the Boolean function, and T is the predetermined threshold. Each operation in a Boolean function can be expressed as a threshold function. Further, multiple Boolean operations in a Boolean function can often be expressed as a single threshold function. Since threshold logic gates evaluate a threshold function, a single threshold logic gate may replace a large number of conventional logic gates that would otherwise be required to perform a particular operation, thereby saving space and resulting in improvements in computation speed and efficiency.

Despite their advantages in size, speed, and efficiency, threshold logic gates have not entered the mainstream due to a lack of efficient and reliable gate implementations and a lack of necessary infrastructure for the design and programming of logic circuits including threshold logic gates. Specifically, threshold logic gates are known to be highly sensitive to manufacturing tolerances, which often results in an undesirable or unpredictable output. Further, the widespread adoption of the logic circuitry design paradigms discussed above has resulted in a large obstacle in the implementation of any logic gates that deviate from current design principles. As a result, logic circuitry including threshold logic gates, and in particular programmable logic circuitry including threshold logic gates, is nearly nonexistent.

Accordingly, there is a present need for a threshold logic gate that is reliable, fast, small, and efficient. Further, there is a need for programmable logic circuitry incorporating one or more threshold logic gates that is compatible with current logic circuitry design paradigms.

SUMMARY

The present disclosure relates to threshold logic circuitry and in particular to programmable threshold logic circuitry. In one embodiment, a field programmable threshold-logic array (FPTLA) includes a number of threshold logic gates and a number of programmable interconnect elements. Each one of the programmable interconnect elements are connected between two or more of the threshold logic gates, such that the programmable interconnect elements route signals between the threshold logic gates. By using threshold logic gates for the FPTLA, the size of the FPTLA may be significantly smaller than conventional solutions. Further, using threshold logic gates for the FPTLA results in significant improvements in the computation speed and efficiency of the FPTLA when compared to conventional solutions.

In one embodiment, each one of the threshold logic gates is a differential threshold logic gate. Further, each one of the threshold logic gates may be configured to evaluate a majority function.

In one embodiment, each one of the threshold logic gates includes a first input network, a second input network, a differential amplifier, and a latch. The first input network receives a first set of input signals and generates a first activation signal at a speed proportional to a combined value of the first set of input signals. The second input network receives a second set of input signals and generates a second activation signal at a speed proportional to combined value of the second set of input signals. The differential amplifier is connected between the first input network and the second input network. Further, the differential amplifier receives the first activation signal and the second activation signal. If the first activation signal is received before the second activation signal, the differential amplifier generates a differential output signal having a first state. If the first activation signal is received after the second activation signal, the differential amplifier generates a differential output signal having a second state. The latch receives the differential output signal and generates a latched output signal based on the state of the differential output signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
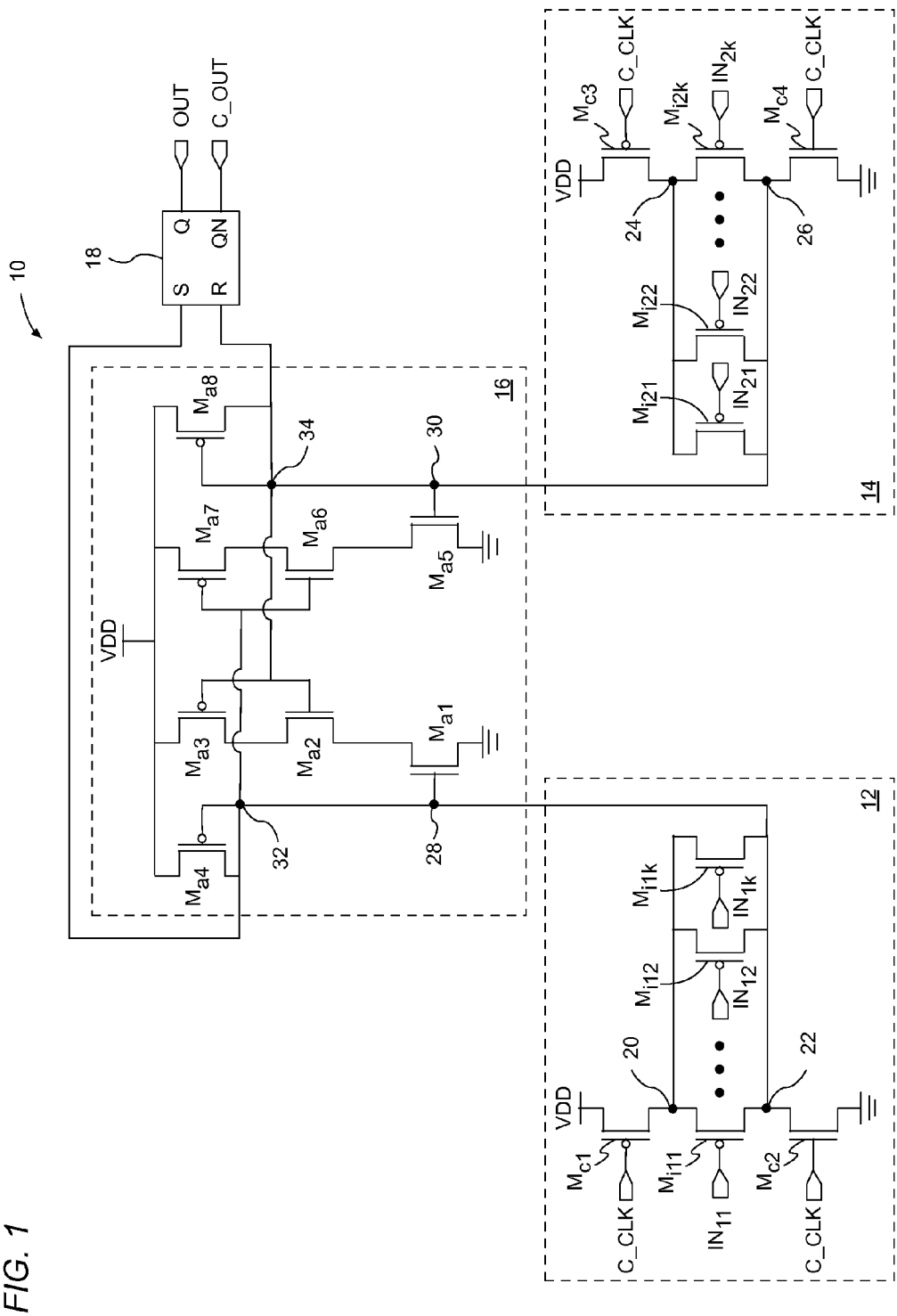
FIG. 1 is a schematic view of a differential threshold logic gate (DTG) according to one embodiment of the present disclosure.

Turning now to FIG. 1, a differential threshold logic gate (DTG) 10 is shown according to one embodiment of the present disclosure. The DTG 10 includes a first input network 12, a second input network 14, a differential amplifier 16, and a latch 18. The first input network 12 includes a first plurality of input transistors $M_{i11}$-$M_{i1k}$ coupled in parallel between a first input control node 20 and a first activation signal node 22. Specifically, each one of the first plurality of input transistors $M_{i11}$-$M_{i1k}$ includes a source contact coupled to the first input control node 20, a drain contact coupled to the first activation signal node 22, and a gate contact, which is configured to receive one of a first plurality of input signals $IN_{11}$-$IN_{1k}$. Further, the first input network 12 includes a first input control transistor $M_{c1}$ and a second input control transistor $M_{c2}$. The first input control transistor $M_{c1}$ includes a source contact coupled to a supply voltage (VDD), a drain contact coupled to the first input control node 20, and a gate contact, which is configured to receive the complement of a clock signal (C_CLK). The second input control transistor $M_{c2}$ includes a source contact coupled to ground, a drain contact coupled to the first activation signal node 22, and a gate contact, which is configured to receive the complement of the clock signal (C_CLK).

The second input network 14 is similar to the first input network 12, and includes a second plurality of input transistors $M_{i21}$-$M_{i2k}$ coupled in parallel between a second input control node 24 and a second activation signal node 26. Specifically, each one of the second plurality of input transistors $M_{i21}$-$M_{i2k}$ includes a source contact coupled to the second input control node 24, a drain contact coupled to the second activation signal node 26, and a gate contact, which is configured to receive one of a second plurality of input signals $IN_{21}$-$IN_{2k}$. Further, the second input network 14 includes a third input control transistor $M_{c3}$ and a fourth input control transistor $M_{c4}$. The third input control transistor $M_{c3}$ includes a source contact coupled to a supply voltage (VDD), a drain contact coupled to the second input control node 24, and a gate contact, which is configured to receive the complement of the clock signal (C_CLK). The fourth input control transistor $M_{c4}$ includes a source contact coupled to ground, a drain contact coupled to the second activation signal node 26, and a gate contact, which is configured to receive the complement of the clock signal (C_CLK).

The differential amplifier 16 includes a first differential input node 28, a second differential input node 30, a first differential output node 32, a second differential output node 34, and a plurality of amplifier transistors $M_{a1}$-$M_{a8}$. A first amplifier transistor $M_{a1}$ includes a source contact coupled to ground, a drain contact, and a gate contact coupled to the first differential input node 28. A second amplifier transistor $M_{a2}$ includes a source contact coupled to the drain contact of the first amplifier transistor $M_{a1}$, a drain contact coupled to the first differential output node 32, and a gate contact coupled to the second differential output node 34. A third amplifier transistor $M_{a3}$ includes a source contact coupled to the power supply voltage (VDD), a drain contact coupled to the first differential output node 32, and a gate contact coupled to the second differential output node 34. A fourth amplifier transistor $M_{a4}$ includes a source contact coupled to the power supply voltage (VDD), a drain contact coupled to the first differential output node 32, and a gate contact coupled to the first differential input node 28.

A fifth amplifier transistor $M_{a5}$ includes a source contact coupled to ground, a drain contact, and a gate contact coupled to the second differential input node 30. A sixth amplifier transistor $M_{a6}$ includes a source contact coupled to the drain contact of the fifth amplifier transistor $M_{a5}$, a drain contact couple to the second differential output node 34, and a gate contact coupled to the first differential output node 32. A seventh amplifier transistor $M_{a7}$ includes a source contact coupled to the power supply voltage (VDD), a drain contact coupled to the second differential output node 34, and a gate contact coupled to the first differential output node 32. Finally, an eighth amplifier transistor $M_{a8}$ includes a source contact coupled to the power supply voltage (VDD), a drain contact coupled to the second differential output node 34, and a gate contact coupled to the second differential input node 30.

In one embodiment, the latch 18 is a set-reset (SR) NAND latch. Accordingly, the latch 18 may include a set input (S) a reset input (R), a latching output (Q), and a complementary latching output (QN). The set input (S) is coupled to the first differential output node 32. The reset input (R) is coupled to the second differential output node 34. One of the latching output (Q) and the complementary latching output (QN) is used as the ultimate output (OUT, C_OUT) of the DTG 10. In other embodiments, any suitable component may be used for the latch 18.

In one embodiment, the first plurality of input transistors $M_{i11}$-$M_{i1k}$, the second set of input transistors $M_{i21}$-$M_{i2k}$, the input control transistors $M_{c1}$-$M_{c4}$, and the amplifier transistors $M_{a1}$-$M_{a8}$ are metal-oxide-semiconductor field-effect transistors (MOSFETs). Specifically, the first plurality of input transistors $M_{i11}$-$M_{i1k}$, the second set of input transistors $M_{i21}$-$M_{i2k}$, the input control transistors $M_{c1}$-$M_{c4}$, and the amplifier transistors $M_{a1}$-$M_{a8}$ may be a mix of NMOS and PMOS MOSFETs, such that the PMOS MOSFETs are indicated by the circle at the gate contact of the transistor. In other embodiments, the first plurality of input transistors $M_{i11}$-$M_{i1k}$, the second set of input transistors $M_{a1}M_{i2k}$, the input control transistors $M_{c1}$-$M_{c4}$, and the amplifier transistors $M_{a1}$-$M_{a8}$ may be any suitable transistors such as field-effect-transistors (FETs), high electron mobility transistors (HEMTs), bipolar junction transistors (BJTs) or the like.

As shown in FIG. 1, each one of the first input network 12 and the second input network 14 includes k input transistors. Accordingly, the DTG 10 is referred to as a DTG-K, and includes 2k inputs. DTGs 10 according to different embodiments of the present disclosure may be made with any number of input transistors (e.g., DTG-5, DTG-7, DTG-9), and therefore may provide a variety of input signal configurations.

In operation, the DTG 10 has two states of operation: a reset state of operation and a evaluation state of operation. In the reset state of operation, the clock signal (CLK) is 0, and the complement of the clock signal (C_CLK) provided to the gate contact of each one of the input control transistors $M_{c1}$-$M_{c4}$ is 1. As discussed herein, signals with a value of "1" refer to signals including a voltage, a current, or both a voltage and a current above a particular threshold, while signals with a value of "0" refer to signals with a voltage, a current, or both a voltage and a current below a particular threshold (i.e., digital signals). Using the complement of the clock signal (C_CLK) to operate the DTG 10 allows the reset state of operation to occur when the clock signal (CLK) is 0, and the evaluation state of operation of the DTG 10 to occur when the clock signal (CLK) is 1, thereby conforming to standard industry practices. When the clock signal (CLK) is 0 and the complement of the clock signal (C_CLK) is 1, the first control transistor $M_{c1}$ and the third control transistor $M_{c3}$ turn OFF (i.e., become an open circuit) and the second control transistor $M_{c2}$ and the fourth control transistor $M_{c4}$ to turn ON (i.e., become a closed circuit). Turning the second control transistor $M_{c2}$ and the fourth control transistor $M_{c4}$ ON connects the first activation signal node 22 and the second activation signal node 26 to ground, which in turn causes the first amplifier transistor $M_{a1}$ and the fifth amplifier transistor $M_{a5}$ to turn OFF and the fourth amplifier transistor $M_{a4}$ and the eighth amplifier transistor $M_{a8}$ to turn ON. This disconnects all discharge paths for the first differential output node 32 and the second differential output node 34, and pulls the first differential output node 32 and the second differential output node 34 high to the supply voltage (VDD) through the fourth amplifier transistor $M_{a4}$ and the eighth amplifier transistor $M_{a8}$, such that the first differential output node 32 and the second differential output node 34 have a value of 1. Note that the second amplifier transistor $M_{a2}$ and the sixth amplifier transistor $M_{a6}$ are turned ON, while the third amplifier transistor $M_{a3}$ and the seventh amplifier transistor $M_{a7}$ are OFF however, this does not affect the functionality of the DTG 10. As discussed above, the latch 18 may be an SR NAND latch, and therefore will not change the state of the latching output (Q) when both the set input (S) and the reset input (R) are 1. Accordingly, the latch 18 stores the previous output value of the first differential output node 32 and the second differential output node 34 in the reset state of operation.

In the evaluation state of operation, the clock signal (CLK) is 1, and the complement of the clock signal (C_CLK) provided to the gate contact of each one of the input control transistors $M_{c1}$-$M_{c4}$ is 0. This causes the first control transistor $M_{c1}$ and the third control transistor $M_{c3}$ to turn ON and the second control transistor $M_{c2}$ and the fourth control transistor $M_{c4}$ to turn OFF. Turning the first control transistor $M_{c1}$ and the third control transistor $M_{c3}$ ON causes the supply voltage (VDD) to be presented to the first input control node 20 and the second input control node 24. The supply voltage (VDD) at the first input control node 20 and the second input control node 24 will be delivered through one or more of the first plurality of input transistors $M_{i11}$-$M_{i1k}$ and one or more of the second plurality of input transistors $M_{i21}$-$M_{i2k}$ to the first activation signal node 22 and the second activation signal node 26, respectively. Depending on the input signals (referred to generally as "IN") presented to the first input network 12 and the second input network 14, a different number of the first plurality of input transistors $M_{i11}$-$M_{i1k}$ and the second plurality of input transistors $M_{i21}$-$M_{i2k}$ will be turned ON in each one of the first input network 12 and the second input network 14. In general, the DTG 10 will always be operated in such a way that the number of active input transistors in the first input network 12 and the second input network 14 are different.

The number of the first plurality of input transistors $M_{i11}$-$M_{i1k}$ that are ON in the first input network 12 determines how quickly the supply voltage (VDD) is passed from the first input control node 20 to the first activation signal node 22, and thus to the first differential input node 28. Similarly, the number of the second plurality of input transistors $M_{i21}$-$M_{i2k}$ in the second input network 14 determines how quickly the supply voltage (VDD) is passed from the second input control node 24 to the second activation signal node 26 and thus the second differential input node 30. As an example, assume that the first plurality of input transistors $M_{i11}$-$M_{i1k}$ includes a larger number of input transistors in the ON state than the second plurality of input transistors $M_{i21}$-$M_{i2k}$. Accordingly, the supply voltage (VDD) from the first input network 12 will reach the first differential input node 28 before the supply voltage (VDD) from the second input network 14 will reach the second differential input node 30. The supply voltage (VDD) as it is delivered from the first input network 12 and the second input network 14 is referred to herein as an "activation signal."

As the supply voltage (VDD) from the first input network 12 reaches the first differential input node 28, the first amplifier transistor $M_{a1}$ is turned ON, the second amplifier transistor $M_{a2}$ is turned ON, the third amplifier transistor $M_{a3}$ is turned OFF, and the fourth amplifier transistor $M_{a4}$ is turned OFF. As a result, the first differential output node 32 is discharged through the first amplifier transistor $M_{a1}$ and the second amplifier transistor $M_{a2}$, which in turn causes the sixth amplifier transistor $M_{a6}$ to turn OFF and the seventh amplifier transistor $M_{a7}$ to turn ON. Accordingly, even if the supply voltage (VDD) from the second input network 14 reaches the second differential input node 30 at a later time, causing the second differential output node to begin to discharge, its further discharge is quickly impeded as the sixth amplifier transistor $M_{a6}$ turns OFF and the seventh amplifier transistor $M_{a7}$ turns ON and the second differential output node 34 is pulled back to the supply voltage (VDD). Accordingly, the differential amplifier 16 produces a 0 (ground) at the first differential output node 32 and a 1 (supply voltage VDD) at the second differential output node 34. As discussed above, the latch 18 may be an SR NAND latch, and therefore produces 1 at the latching output (Q).

In the event that the second plurality of input transistors $M_{i21}$-$M_{i2k}$ includes a larger number of input transistors in the ON state than the first plurality of input transistors $M_{i11}$-$M_{i1k}$, the result is the opposite, wherein the differential amplifier 16 produces a 1 (supply voltage VDD) at the first differential output node 32 and a 0 (ground) at the second differential output node 34. Accordingly, the latch 18 produces a 0 at the latching output (Q).

As discussed above, a threshold function is one that computes a weighted sum for a number of variables $x_1$, $x_2, \ldots, x_n$ and their associated weights $w_1, w_2, \ldots, w_i$, and compares the weighted sum to a predetermined threshold T. The variables $x_1, x_2, \ldots, x_n$ of a threshold function are represented in the DTG 10 by the first plurality of input signals $IN_{11}$-$IN_{1k}$ provided to the first input network 12, while their associated weights $w_1, w_2, \ldots, w_i$ are represented by the number of different input transistors to which a particular input signal is provided. For example, if a given variable has an associated weight of two, the input signal that is representative of the variable will be provided to two different input transistors in the first plurality of input transistors $M_{i11}M_{i1k}$. Similarly, the predetermined threshold T is determined by the second plurality of input signals $IN_{21}$-$IN_{2k}$ provided to the second plurality of input transistors $M_{i21}$-$M_{i2k}$ in the second input network 14. By providing various input signals IN to the input transistors in the first input network 12 and the second input network 14, any number of threshold functions may be evaluated by the DTG 10.

Figure 2:
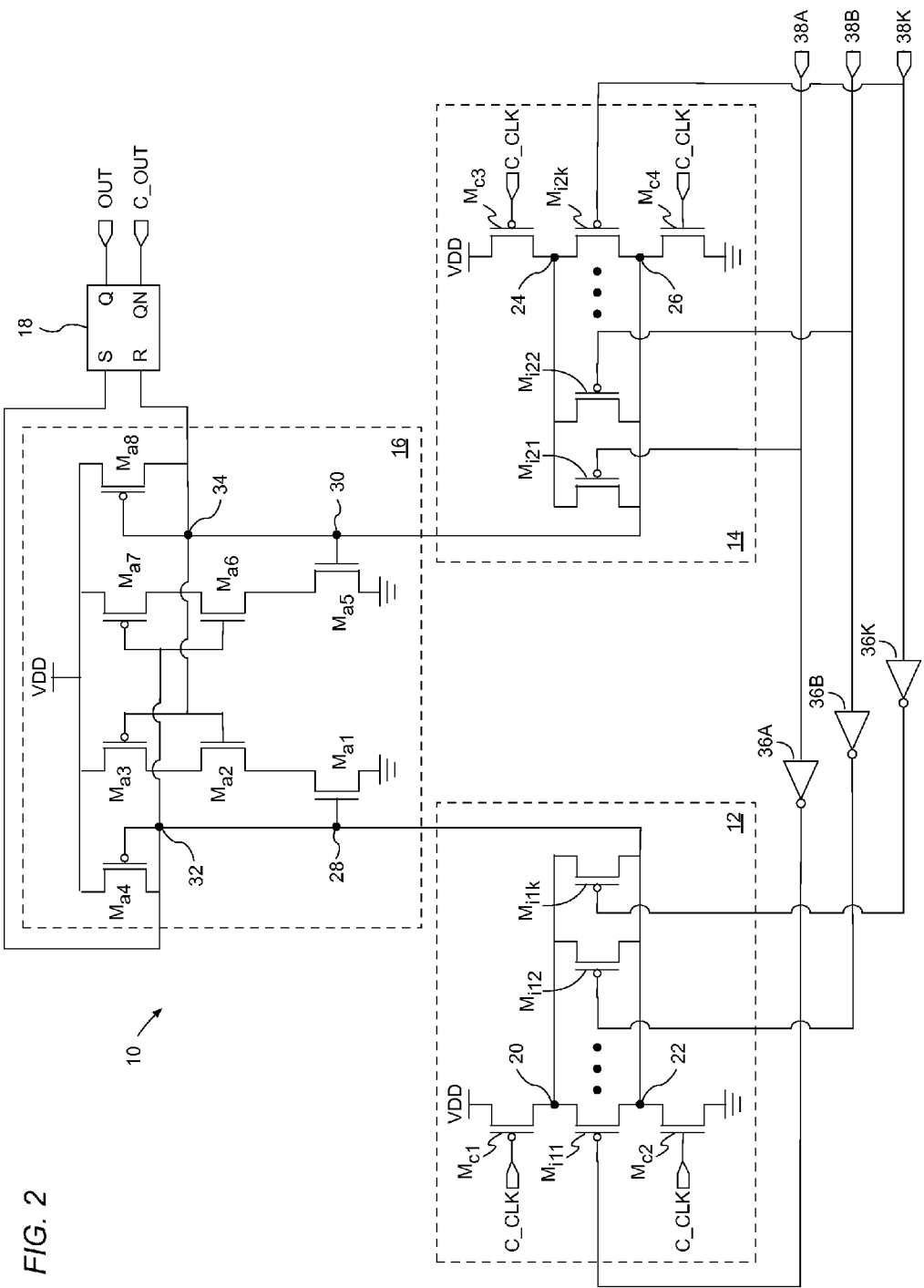
FIG. 2 is a schematic view of a DTG according to an additional embodiment of the present disclosure.

There are many different ways to map signals to the DTG 10 while satisfying the constraint that the first input network 12 and the second input network 14 do not include the same number of active input transistors. The different signal assignments will result in different delay, power, and robustness to process variations in the various transistors in the DTG 10. In some embodiments, 2k inputs may be too many, as it may result in unnecessary congestion in larger circuitry in which the DTG 10 is integrated. Accordingly, the first input network 12 and the second input network 14 may be connected as shown in FIG. 2 such that the DTG 10 is configured to evaluate a majority function. The DTG 10 shown in FIG. 2 is substantially similar to that shown in FIG. 1, but further includes connections between the first plurality of input transistors $M_{i11}$-$M_{i1k}$ in the first input network 12 and the second plurality of input transistors $M_{i21}$-$M_{i2k}$ in the second input network 14. Further, an inverter 36A-36K is coupled between each one of the input transistors in the first input network 12 and the second input network 14. The result is a number of unified input nodes 38A-38K, which are connected to both the first input network 12 and the second input network 14. Connecting the first input network 12 and the second input network 14 as shown reduces the number of inputs to the DTG 10 by a factor of 2, resulting in a DTG 10 that is configured to evaluate a majority function.

As defined herein, a m out of n majority function is a Boolean function that produces a 1 if at least m of the input signals are high signals. The DTG shown in FIG. 2 implements a (k+1)/2 out of k majority function. Specifically, whenever n of the first plurality of input transistors $M_{i11}$-$M_{i1k}$ are turned ON, k−n of the second plurality of input transistors $M_{i21}$-$M_{i2k}$ are turned ON. To ensure that the number of active input transistors in the first input network 12 and the second input network 14 are not equal, k must be kept odd. Whenever at least (k+1)/2 of the input signals provided to the unified input nodes 38A-38K are high signals, the first input network 12 will have a larger number of active input transistors than the second input network 14, resulting in the latching output (Q) of the DTG 10 evaluating to a 1. In contrast, when less than (k+1)/2 of the input signals provided to the unified input nodes 38A-38K are high signals, the first input network 12 will have a smaller number of active input transistors than the second input network 14, resulting in the latching output (Q) of the DTG 10 evaluating to a 0.

Any threshold function $f=[w_1, w_2, \ldots, w_n | T]$ can be implemented using a T out of W majority function, where $W=\Sigma w_i$. For example consider a threshold function $f(a,b,c)=aVbc=[2,1,1; 2]$, where $w_a=2$, $w_b=w_c=1$ and $T=2$. Here $T=2$ and $W=4$. Given a 2 out of 4 majority function $q(p,q,r,s)=[1,1,1,1; 2]$, $f$ can be realized by simply connecting signal a to the inputs p and and q, signal b to r, and signal c to the input s of function g. The 2 out of 4 majority is also realizable using a 3 out of 5 majority by simply setting one of its inputs to 1. Accordingly, any majority function has a fixed subset of threshold functions it can implement under all possible assignments of signals to its inputs.

Consider implementing a 4-input AND gate $f(a, b, c, d)$ using a 4 out of 7 majority $q(p,q,r,s,t,u,v)$. The assignment $p=a$, $q=b$, $r=c$, $s=d$, $t=u=v=0$ realizes this function. Only when all of a, b, c and d are high signals is the 4 out of 7 majority reached, resulting in a high signal output. As illustrated by the examples above, a given DTG 10 is configured as shown in FIG. 2 and is capable of evaluating a number of Boolean operations by simply routing input signals (including constants) to the various unified input nodes 38A-38K. For example, a DTG 10 including seven input transistors in each one of the first input network 12 and the second input network 14 (and therefore seven unified input nodes 38A-40F) is capable of evaluating at least 30 Boolean expressions, some with up to 35 terms.

One advantage of the DTG 10 configuration shown in FIG. 2 is that it simplifies the design and testing of the DTG 10. In particular, the DTG 10 shown in FIG. 2 includes a worst-case performance scenario for both delay and robustness, which results in significant improvements in the ease of the design and testing of the DTG 10. Specifically, the maximum delay of the DTG 10 occurs for |m−n|=1, which is also the most likely input configuration for which the DTG 10 will fail due to intolerance to manufacturing variations. Accordingly, the design of the DTG 10 must only be done to optimize performance and robustness for a single input configuration at all process corners while accounting for process variations. For example, the delay and robustness of a DTG-7 need only be optimized for an input configuration of 4/3. If such a DTG evaluates correctly for this configuration under all conditions, then it will evaluate correctly for all other input configurations.

In addition to the advantages discussed above, the DTG 10 shown in FIG. 2 further includes the advantage that the probability of a correct computation performed by the DTG 10 increases with temperature. This property is herein referred to as temperature monotonicity. Temperature monotonicity ensures that if a particular DTG properly functions at a given temperature, it will continue to function properly at temperatures above the given temperature. This results in significant time and cost savings in the testing of simulated and manufactured DTG cells. The explanation for this behavior is simple. Suppose there are n input transistors ON in the first input network 12 and n−1 input transistors ON in the second input network 14. Let $$Z_L \approx \frac{1}{n} \text{ and } Z_R \approx \frac{1}{(n-1)}.$$

The greater the difference $$|Z_L - Z_R| = \frac{1}{n(n-1)},$$

the more likely that the DTG 10 will compute the correct value. As n increases, each individual impedance decreases, as does their difference (quadratically). The increase in temperature counteracts this effect by increasing the impedance of the first input network 12 and the second input network 14. Additionally, the temperature effect is nonlinear. Thus, the increase of the impedance of the first input network 12 and the second input network 14 need not be the same.

Figure 3:
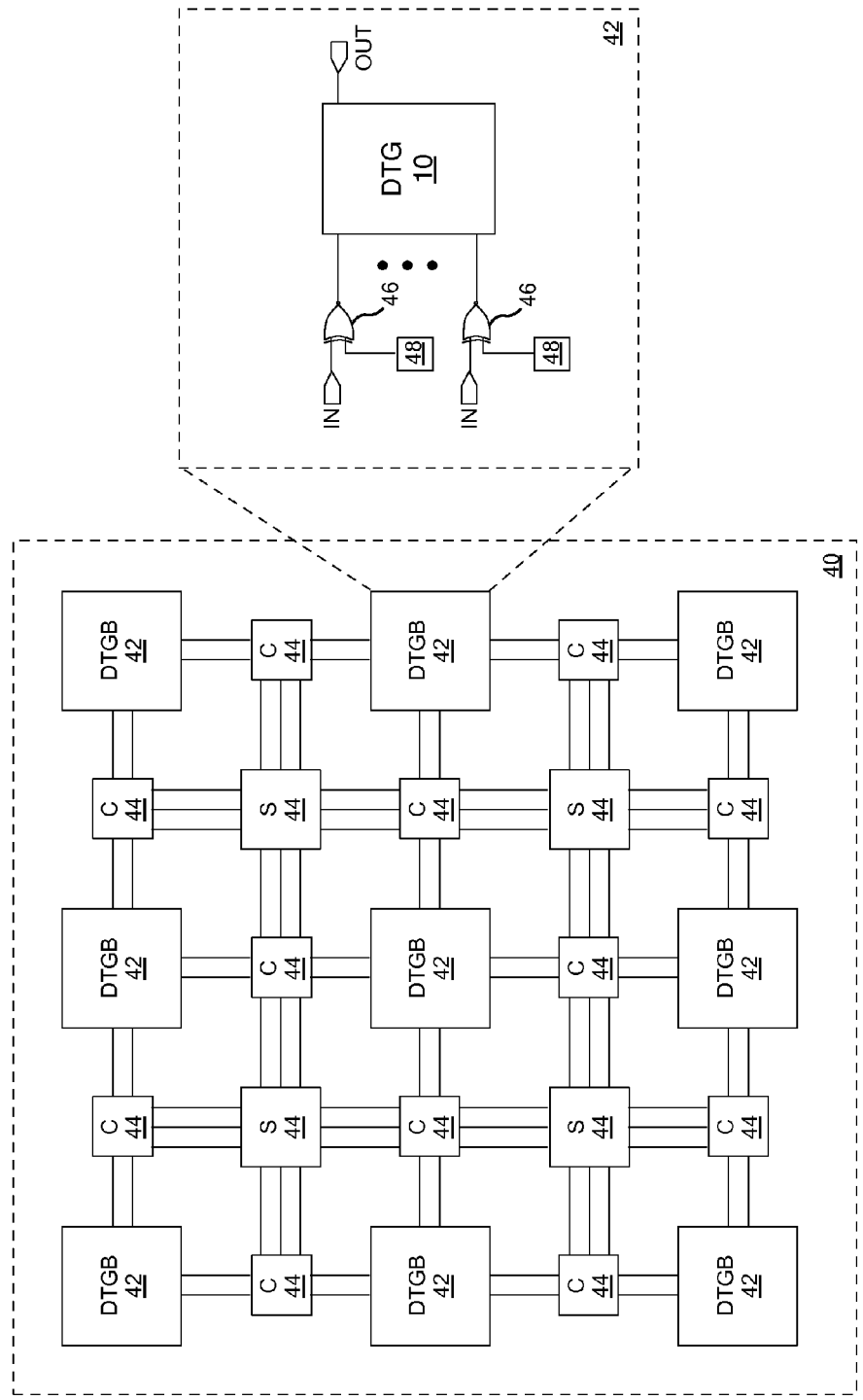
FIG. 3 is a block diagram illustrating a field programmable threshold logic array (FPTLA) according to one embodiment of the present disclosure.

As discussed above, the DTG 10 shown in FIG. 2 is capable of evaluating one or more Boolean expressions simply by routing particular input signals to the unified input nodes 38A-38K of the DTG 10. Accordingly, the DTG 10 shown in FIG. 2 is particularly well suited for use in programmable logic circuitry. FIG. 3 shows a field programmable threshold logic array (FPTLA) 42 according to one embodiment of the present disclosure. The FPTLA 40 includes a plurality of DTG blocks (DTGBs) 42 and a plurality of programmable interconnect elements 44, each coupled between at least two of the plurality of DTGBs 42. As shown in the exploded view of one of the DTGBs 42, each DTGB 42 includes a DTG 10 (such as that shown in FIG. 2), a plurality of XOR gates 46, and a plurality of static random access memory (SRAM) cells 48. The XOR gates 46 together with the SRAM cells 48 allow the DTG 10 to receive a particular input signal or a complement thereof.

The programmable interconnect elements 44 include connection boxes (C) and switch boxes (S). The connection boxes (C) connect the channel wires to the input and output pins of the DTGBs 42. The switch boxes (S) allow wires to switch between vertical and horizontal wires. The purpose of the resulting routing grid is to connect appropriate signals to the inputs of each DTGB 42 including the required constants.

As discussed above, each one of the DTGs 10 is capable of computing a large set of Boolean expressions based on the input signals provided to the DTG 10. Accordingly, by appropriately routing signals between the DTGBs 42 in the FPTLA 40, the FPTLA 40 can compute complex Boolean expressions. Each DTGB 42 in the FPTLA 40 includes a significantly smaller number of components such as transistors and SRAM cells when compared to conventional configurable logic blocks (CLBs). Accordingly, each one of the DTGBs 42 is smaller, faster, and more efficient than its conventional counterpart. Additionally, due to the lack of intervening logic between DTGBs 42 in the FPTLA 40, the circuit is what is herein referred to as "nano-pipelined". In other words, each and every one of the DTGBs 42 is clocked such that there are no un-clocked elements between the various DTGBs 42. This nano-pipelining results in further performance improvements when compared to conventional logic circuitry equivalents.

Figure 4:
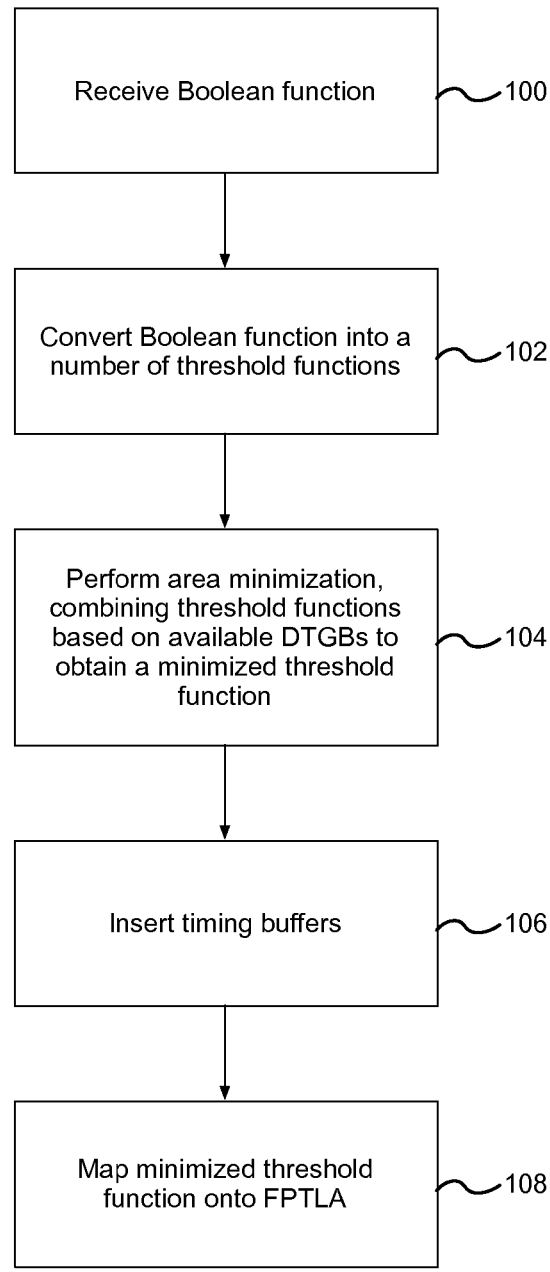
FIG. 4 is a flow diagram illustrating a method for programming the FPTLA shown in FIG. 3 according to one embodiment of the present disclosure.

While the DTGBs 42 in the FPTLA 40 are a vast departure from conventional logic circuitry technology, the programmable interconnect elements 44 remain similar to existing logic circuitry such as field programmable gate arrays (FPGAs). Accordingly, the FPTLA 40 may be easily programmed according to current design paradigms. FIG. 4 is a flow diagram illustrating a method of programming the FPTLA 40 according to one embodiment of the present disclosure. First, a Boolean function for which evaluation is desired is received (step 100). Notably, the Boolean expression is developed according to current design paradigms, and thus each operation in the Boolean function includes only two inputs and a single output (each operation in the Boolean function represents an AND, OR, NOT, etc. logic gate). As discussed above, a Boolean function may be re-characterized as one or more threshold functions. Accordingly, the Boolean function is converted to a number of threshold functions, one for each operation within the Boolean function (step 102). Since each operation in the Boolean function has only two inputs and a single output, the resulting threshold functions will be highly inefficient if individually mapped onto the FPTLA 40. In other words, since the DTGBs 42 in the FPTLA 40 include more than two inputs, using only two of the inputs for each DTGB 42 will result in the use of an unnecessary number of the DTGBs 42. Thus, an area minimization method is performed in order to combine as many of the threshold functions as possible into a minimized threshold function (step 104). Well known techniques such as node elimination may be used to combine the threshold expressions. In particular, depending on the number of inputs available for each DTGB 42, a set of threshold functions whose combination is capable of evaluation by one of the DTGBs 42 may be combined in order to reduce the number of DTGBs 42 used for evaluation of the Boolean expression.

Since the FPTLA 40 is a nano-pipelined circuit, as discussed above, each path from a primary input to any primary output must have the same number of clocked elements. The minimized threshold expression may include computation paths of different lengths, thereby necessitating the insertion of timing buffers in order to ensure that each path from a primary input to a primary output has the same number of clocked elements (step 106). In one embodiment, a single DTGB 44 is used as a timing buffer. It should be noted that the number of timing buffers should be as small as possible since timing buffers do not compute to useful computation. A variety of techniques can be used to determine the minimum possible number of timing buffers necessary to ensure proper functionality of the FPTLA 40, all of which are contemplated herein. Finally, the minimized threshold expression including timing buffers can be mapped onto the FPTLA 40 by appropriately routing connections between each one of the DTGBs 42 (step 108). Using the method described above, conventional design paradigms may be used to program the FPTLA 40 without significant effort on behalf of the designer or programmer. Accordingly, the performance enhancements in size, speed, and efficiency may be obtained with little to no cost or effort.

As discussed above, DTGs 10 may be sensitive to manufacturing tolerances, which are often experienced by the transistor elements that make up the DTG 10. Accordingly, one or more of the DTGs 10 in the DTGBs 42 may fail to properly evaluate the intended majority function. However, due to the nature of threshold functions, if a particular DTG 10 does not implement an intended majority function, it can still be shown that the DTG 10 implements some threshold function. Consider the inequality $\Sigma_i W_i x_i \geq T$. The manufacturing variations discussed above simply perturb the value of the weights represented by the conductance of each of the transistors in the first input network 12 and the second input network 14. Regardless of the perturbation in weights from normal, however, the resultant expression is still an arithmetic inequality and therefore represents a threshold function. Accordingly, in a field programmable environment such as the FPTLA 40, a set of functions that each DTGB 42 can be determined after the FPTLA 40 has been fabricated, and a particular DTGB 42 can be noted as capable only of evaluating certain threshold functions. When programming the FPTLA 40, such DTGBs 42 will be assigned only those threshold functions that they are capable of evaluating, thereby allowing DTGBs 42 that may otherwise be bypassed to be used and reducing the required redundancy measures of the FPTLA 40.

Alternatively, if a particular DTGB 42 is determined to improperly evaluate the intended majority function, the DTGB 42 may be noted and not used by the FPTLA 40. Instead, redundant DTGBs 42 may be used in place of the defective DTGB 42. The amount of DTGBs 42 that should be included in a particular FPTLA 40 is denoted in Equation 2:

$$Y = \sum_{k=0}^{m} \binom{N+m}{k} P^{N+m-k}(1-P)^k \quad (2)$$

Where N is the number of DTGBs 42 in the FPTLA 40, m is the number of additional cells required to ensure a probability P that a particular DTGB 42 functions correctly for a given probability of success (yield) Y. As an example, the number of additional DTGBs 42 to ensure a yield Y≥0.999 for a 128-bit comparator including DTGBs 42 configured to evaluate a 4/7 majority function is only 60 cells (with the base size of the total grid being 961). In other words, only 6% more DTGBs 42 are required to ensure a 99.9% yield for a 128-bit comparator using DTGBs 42 configured to evaluate a 4/7 majority function. Accordingly, the cost of redundancy measures on FPTLAs 40 may be reduced when compared to conventional logic circuitry.

Those skilled in the art will recognize improvements and modifications to the embodiments of the present disclosure. All such improvements and modifications are considered within the scope of the concepts disclosed herein and the claims that follow.

What is claimed is:

1. A field programmable threshold-logic array (FPTLA) comprising:
    a plurality of threshold logic gates;
    a plurality of programmable interconnect elements each coupled between at least two of the plurality of threshold logic gates and configured to route signals between the plurality of threshold logic gates.

2. The FPTLA of claim 1 wherein each one of the plurality of threshold logic gates is a differential threshold logic gate.

3. The FPTLA of claim 2 wherein each one of the plurality of threshold logic gates is configured to evaluate a majority function.

4. The FPTLA of claim 1 wherein each one of the plurality of threshold logic gates comprises:
    a first input network configured to receive a first plurality of input signals and generate a first activation signal at a speed proportional to a combined value of the first plurality of input signals;
    a second input network configured to receive a second plurality of input signals and generate a second activation signal at a speed proportional to a combined value of the second plurality of input signals;
    a differential amplifier coupled between the first input network and the second input network and configured to:
        receive the first activation signal and the second activation signal;
        generate a differential output signal having a first state if the first activation signal is received before the second activation signal; and
        generate a differential output signal having a second state if the second activation signal is received before the first activation signal; and
    a latch configured to receive the differential output signal from the differential amplifier and generate a latched output signal based on the state of the differential output signal.

5. The FPTLA of claim 4 wherein each one of the first plurality of input signals is equal to a complement of a corresponding one of the second plurality of input signals.

6. The FPTLA of claim 4 wherein:
    the first input network comprises a first plurality of transistors coupled in parallel between a first input control node and a first activation signal node; and
    the second input network comprises a second plurality of transistors coupled in parallel between a second input control node and a second activation signal node.

7. The FPTLA of claim 6 wherein the first plurality of transistors and the second plurality of transistors are metal-oxide-semiconductor field-effect-transistors (MOSFETs).

8. The FPTLA of claim 6 wherein:
    in a reset state of operation of the first input network and the second input network, the first input control node and the second input control node are left floating and the first activation signal node and the second activation signal node are coupled to ground; and in a set state of operation of the first input network and the second input network, the first input control node and the second input control node are connected to a power supply voltage and the first activation signal node and the second activation signal node are left floating.

9. The FPTLA of claim 6 wherein the differential amplifier comprises:
a first differential input node, a second differential input node, a first differential output node, and a second differential output node;
a first transistor including a source contact coupled to ground, a drain contact, and a gate contact coupled to the first differential input node;
a second transistor including a source contact coupled to the drain contact of the first transistor, a drain contact coupled to the first differential output node, and a gate contact coupled to the second output node;
a third transistor including a source contact coupled to a power supply voltage, a drain contact coupled to the first differential output node, and a gate contact coupled to the second differential output node;
a fourth transistor including a source contact coupled to the power supply voltage, a drain contact coupled to the first differential output node, and a gate contact coupled to the first input node;
a fifth transistor including a source contact coupled to ground, a drain contact, and a gate contact coupled to the second differential input node;
a sixth transistor including a source contact coupled to the drain contact of the fifth transistor, a drain contact coupled to the second differential output node, and a gate contact coupled to the first differential output node;
a seventh transistor including a source contact coupled to the power supply voltage, a drain contact coupled to the first differential output node, and a gate contact coupled to the first differential output node; and
an eighth transistor including a source contact coupled to the power supply voltage, a drain contact coupled to the second differential output node, and a gate contact coupled to the second differential input node.

10. The FPTLA of claim 9 wherein the first transistor, the second transistor, the third transistor, the fourth transistor, the fifth transistor, the sixth transistor, the seventh transistor, and the eighth transistor are metal-oxide-semiconductor field-effect-transistors (MOSFETs).

11. The FPTLA of claim 9 wherein the latch is a set-reset (SR) NOR latch.

12. The FPTLA of claim 9 wherein:
the first input network comprises a first plurality of transistors coupled in parallel between a first input control node and a first activation signal node; and
the second input network comprises a second plurality of transistors coupled in parallel between a second input control node and a second activation signal node.

13. The FPTLA of claim 12 wherein the first activation signal node is coupled to the first differential input node and the second activation signal node is coupled to the second differential input node.

14. The FPTLA of claim 13 wherein:
in a reset state of operation of the first input network and the second input network, the first input control node and the second input control node are left floating and the first activation signal node and the second activation signal node are coupled to ground; and
in a set state of operation of the first input network and the second input network, the first input control node and the second input control node are connected to a power supply voltage and the first activation signal node and the second activation signal node are left floating.

15. The FPTLA of claim 14 wherein the latch comprises:
a set input node coupled to the first differential output node;
a reset input node coupled to the second differential output node; and
one or more output nodes.

16. The FPTLA of claim 15 wherein the node is a set-reset (SR) NOR latch.

17. A differential threshold logic gate (DTG) comprising:
a first input network configured to receive a first plurality of input signals and generate a first activation signal at a speed proportional to a combined value of the first plurality of input signals;
a second input network configured to receive a second plurality of input signals and generate a second activation signal at a speed proportional to a combined value of the second plurality of input signals;
a differential amplifier coupled between the first input network and the second input network and configured to:
receive the first activation signal and the second activation signal;
generate a differential output signal having a first state if the first activation signal is received before the second activation signal; and
generate a differential output signal having a second state if the second activation signal is received before the first activation signal; and
a latch configured to receive the differential output signal from the differential amplifier and generate a latched output signal based on the state of the differential output signal.

18. The DTG of claim 17 wherein each one of the first plurality of input signals is equal to a complement of a corresponding one of the second plurality of input signals.

19. The DTG of claim 17 wherein:
the first input network comprises a first plurality of input transistors coupled in parallel between a first input control node and a first activation signal node; and
the second input network comprises a second plurality of input transistors coupled in parallel between a second input control node and a second activation signal node.

20. The DTG of claim 19 wherein the first plurality of transistors and the second plurality of transistors are metal-oxide-semiconductor field-effect-transistors (MOSFETs).

21. The DTG of claim 19 wherein:
in a reset state of operation of the first input network and the second input network, the first input control node and the second input control node are left floating and the first activation signal node and the second activation signal node are coupled to ground; and
in a set state of operation of the first input network and the second input network, the first input control node and the second input control node are connected to a power supply voltage and the first activation signal node and the second activation signal node are left floating.

22. The DTG of claim 17 wherein the differential amplifier comprises:
a first differential input node, a second differential input node, a first differential output node, and a second differential output node;
a first transistor including a source contact coupled to ground, a drain contact, and a gate contact coupled to the first differential input node;

a second transistor including a source contact coupled to the drain contact of the first transistor, a drain contact coupled to the first differential output node, and a gate contact coupled to the second differential output node;

a third transistor including a source contact coupled to a power supply voltage, a drain contact coupled to the first differential output node, and a gate contact coupled to the second differential output node;

a fourth transistor including a source contact coupled to the power supply voltage, a drain contact coupled to the first differential output node, and a gate contact coupled to the first differential input node;

a fifth transistor including a source contact coupled to ground, a drain contact, and a gate contact coupled to the second differential input node;

a sixth transistor including a source contact coupled to the drain contact of the fifth transistor, a drain contact coupled to the second differential output node, and a gate contact coupled to the first differential output node;

a seventh transistor including a source contact coupled to the power supply voltage, a drain contact coupled to the second differential output node, and a gate contact coupled to the first differential output node; and an eighth transistor including a source contact coupled to the power supply voltage, a drain contact coupled to the second differential output node, and a gate contact coupled to the second differential input node.

23. The DTG of claim 22 wherein the first transistor, the second transistor, the third transistor, the fourth transistor, the fifth transistor, the sixth transistor, the seventh transistor, and the eighth transistor are metal-oxide-semiconductor field-effect-transistors (MOSFETs).

24. The DTG of claim 22 wherein the latch is a set-reset (SR) NOR latch.

25. The DTG of claim 22 wherein:
the first input network comprises a first plurality of transistors coupled in parallel between a first input control node and a first activation signal node; and
the second input network comprises a second plurality of transistors coupled in parallel between a second input control node and a second activation signal node.

26. The DTG of claim 25 wherein the first activation signal node is coupled to the first differential input node and the second activation signal node is coupled to the second differential input node.

27. The DTG of claim 26 wherein:
in a reset state of operation of the first input network and the second input network, the first input control node and the second input control node are left floating and the first activation signal node and the second activation signal node are coupled to ground; and
in a set state of operation of the first input network and the second input network, the first input control node and the second input control node are connected to a power supply voltage and the first activation signal node and the second activation signal node are left floating.

28. The DTG of claim 27 wherein the latch comprises:
a set input node coupled to the first differential output node;
a reset input node coupled to the second differential output node; and
one or more output nodes.

29. The DTG of claim 28 wherein the latch is a set-reset (SR) NOR latch.

* * * * *